United States Patent
Yoshimoto et al.

(10) Patent No.: US 10,287,096 B2
(45) Date of Patent: May 14, 2019

(54) ARTICLE SUPPORT RACK (71) Applicant: Daifuku Co., Ltd., Osaka-shi (JP)

(72) Inventors: Tadahiro Yoshimoto, Hinocho (JP); Hideo Yoshioka, Hinocho (JP); Takeshi Abe, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 0 days.

(21) Appl. No.: 16/019,969

(22) Filed: Jun. 27, 2018

(65) Prior Publication Data

US 2019/0002200 A1 Jan. 3, 2019

(30) Foreign Application Priority Data

Jun. 30, 2017 (JP) .................................. 2017-129062

(51) Int. Cl.
*B65G 1/02* (2006.01)
*A47B 57/56* (2006.01)
*H01L 21/677* (2006.01)
*B65G 1/04* (2006.01)

(52) U.S. Cl.
CPC ................ *B65G 1/02* (2013.01); *A47B 57/56* (2013.01); *H01L 21/67769* (2013.01); *B65G 1/0407* (2013.01)

(58) Field of Classification Search
CPC .. B65G 1/02; B65G 1/20; A47B 57/42; A47B 57/46; A47B 57/56
See application file for complete search history.

(56) References Cited

U.S. PATENT DOCUMENTS

| | | | | | |
|---|---|---|---|---|---|
| 404,004 | A | * | 5/1889 | Hovey | A47B 57/42 248/243 |
| 768,295 | A | * | 8/1904 | Palfrey | A47B 57/42 248/243 |
| 2,191,701 | A | * | 2/1940 | Wood | A47B 57/42 248/243 |
| 2,940,603 | A | * | 6/1960 | Riedmaier | A47B 57/42 108/152 |
| 4,156,515 | A | * | 5/1979 | Mochly | A47B 57/567 108/108 |

(Continued)

FOREIGN PATENT DOCUMENTS

| | | | | |
|---|---|---|---|---|
| DE | 29920570 U1 | * | 2/2000 | ............ A47B 57/42 |
| GB | 1560724 A | * | 2/1980 | ............ A47B 57/56 |

(Continued)

*Primary Examiner* — Stanton L Krycinski
(74) *Attorney, Agent, or Firm* — The Webb Law Firm (57) ABSTRACT An article support rack is disclosed having a plurality of rack portions. Each shelf row includes one or more main body portions and rib portions, and is supported by shelf support members in a cantilever fashion from a back-face side. Each of the rib portions is located, in plan view, between two articles that are adjacent to each other along a first direction and that are supported by a lower level shelf row which is one of the shelf rows that is located one level below a shelf row to which the rib portion is provided. Each of the rib portions has a first portion located higher than lower level articles each of which is an article supported by the lower level shelf row, and a second portion located lower than the first portion. Each second portion is so located that the second portion does not overlap with the maximum width areas of a lower level article as seen along the first direction.

5 Claims, 7 Drawing Sheets

(56) References Cited

U.S. PATENT DOCUMENTS

| | | | | | |
|---|---|---|---|---|---|
| 4,299,368 | A | * | 11/1981 | Winkler | A47B 57/56 108/108 |
| 9,045,282 | B2 | * | 6/2015 | Yoshioka | B65G 1/02 |
| 9,173,506 | B2 | * | 11/2015 | Andersson | A47B 57/42 |
| 9,187,300 | B2 | * | 11/2015 | Yoshioka | B66F 9/07 |
| 9,245,782 | B2 | * | 1/2016 | Yoshioka | H01L 21/67359 |
| 9,272,844 | B2 | * | 3/2016 | Yoshioka | B65G 1/02 |
| 9,457,955 | B2 | * | 10/2016 | Omori | B65G 1/02 |
| 9,725,953 | B2 | * | 8/2017 | Morikawa | E06C 7/16 |
| 2003/0102277 | A1 | * | 6/2003 | Tai | B65G 1/02 211/187 |
| 2011/0315479 | A1 | * | 12/2011 | Yoshioka | B65G 1/02 182/129 |
| 2011/0315488 | A1 | * | 12/2011 | Yoshioka | B65G 1/02 187/262 |

FOREIGN PATENT DOCUMENTS

| | | | | | |
|---|---|---|---|---|---|
| JP | 2002252277 | A | * | 9/2002 | |
| JP | 2003171003 | A | * | 6/2003 | B65G 1/02 |

\* cited by examiner

ARTICLE SUPPORT RACK

CROSS-REFERENCE TO RELATED APPLICATION

This application claims priority to Japanese Patent Application No. 2017-129062 filed Jun. 30, 2017, the disclosure of which is hereby incorporated in its entirety by reference.

FIELD OF THE INVENTION

The present invention relates to an article support rack having a plurality of levels of rack portions so that the rack portions are arranged one rack portion over another along a vertical direction, each rack portion being capable of supporting a plurality of articles with the articles arranged one adjacent to another along a first direction parallel to a horizontal plane.

BACKGROUND

An example of article support racks such as one described above is disclosed in JP Publication of Application No. 2002-252277 (Patent Document 1). FIG. 5 of Patent Document 1 shows a storage rack (50) comprising a plurality of storage sections (55) each for storing a semiconductor wafer carrier with the storage sections (55) located next to each other along a horizontal direction. Any two storage sections (55) that are adjacent to each other along the horizontal direction are separated from each other by a vertical support frame member (52) which extends forward from a back plate (51). And each lateral end of the top board (53) for supporting a semiconductor wafer carrier is fixed to a shelf supporting member (54) provided to each vertical support frame member (52). Note that the reference numerals in parentheses in the description in this background section are those used in Patent Document 1.

SUMMARY OF THE INVENTION

As such, provided to rack portions each of which can support a plurality of articles with the articles arranged along the horizontal direction in the article support rack shown in FIG. 5 of Patent Document 1 are vertical support frame members which are used to separate the storage sections (storage locations for articles) that are adjacent to each other along the horizontal direction. And each of these vertical support frame members is so arranged to extend from the back face toward the front face of the article support rack at a location between two articles that are horizontally adjacent to each other. And thus, in such an article support rack, the distance between any two supported articles which are horizontally adjacent to each other on a rack portion tends to be relatively large because of the presence of the vertical support frame member, which tends to lower the article storage efficiency of the article support rack.

To address this issue, an article support rack is desired for which the article storage efficiency is improved while properly maintaining article supporting strength of the rack portions.

An article support rack having a plurality of levels of rack portions so that the rack portions are arranged one rack portion over another along a vertical direction, each rack portion being capable of supporting a plurality of articles with the articles arranged one adjacent to another along a first direction parallel to a horizontal plane, the article support rack comprises: shelf rows each of which is provided to corresponding one of the plurality of levels of rack portions and is configured to support articles from below with each of the plurality of levels of rack portions including a shelf row; and shelf support members which support the shelf rows. Each of the shelf rows includes one or more main body portions each of which is plate-shaped and oriented parallel to a horizontal plane, and rib portions each of which projects downward with respect to corresponding one of the one or more main body portions of a shelf row that the rib portion is a portion of, each of the rib portions extending from corresponding one of the shelf support members in a front-face side direction which is one direction along a second direction which is perpendicular to the first direction as seen along a vertical direction. Each of the shelf rows is supported by the shelf support members in a cantilever-fashion from a back-face side of the each of the shelf rows where the back-face side being a side corresponding to a back-face side direction, which is a direction along the second direction that is opposite from the front-face side direction. wherein outer surfaces of each article include maximum width areas in which a dimension along a lateral width direction of the article is greatest, and width decreasing areas in which a dimension along the lateral width direction of the article decreases toward a depth direction side end of the article with the depth direction being a direction perpendicular to the lateral width direction, Each of the shelf rows is configured to support articles with each article being so oriented that the depth direction thereof points toward the back-face side. Each of the rib portions is so located, in plan view, to be between two articles that are adjacent to each other along the first direction and are supported by a lower level shelf row which is one of the shelf rows that is located one level below a shelf row to which the rib portion is provided, when such two articles are so supported. Each of the rib portions has a first portion so located to be higher than a lower level article which is an article supported by the lower level shelf row, and a second portion located lower than the first portion, when such a lower level article is so supported. Each second portion is so located that the second portion does not overlap with the maximum width areas of a lower level article as seen along the first direction and is so located that, as seen along the first direction, the second portion overlaps with at least one of (a) width decreasing areas and (b) any portion or portions that are located to the back-face side of the width decreasing areas, of the lower level article when supported.

With such an arrangement, since each shelf row includes rib portions in addition to one or more main body portions, each shelf row supported in a cantilever fashion by the shelf support members can be strengthened against bending moment applied to it, thus, allowing proper structural strength of each shelf row for supporting articles to be maintained.

And, with such an arrangement, each of such rib portions used to properly maintaining structural strength for supporting articles has a first portion so located to be higher than a lower level article which is an article supported by the lower level shelf row, and a second portion located lower than the first portion. And each second portion is so located that the second portion does not overlap with the maximum width areas of a lower level article as seen along the first direction. This allows for an arrangement in which neither the first portion nor the second portion of the rib portion is located in a space across which two maximum width areas (of two articles that are supported by a lower level shelf row and are adjacent to each other along the first direction) face each other along the first direction. As a result, it becomes possible to secure a distance between a lower level article and other surrounding objects and also to reduce the separation distance, along the first direction, between the two mutually-facing maximum width areas of two lower level articles that are adjacent to each other along the first direction, compared with a case in which a rib portion is located in such a space across which two maximum width areas face each other. And so, the article storage efficiency of the article support rack can be maintained at a high level.

Further, with the present arrangement described above, the second portion of each of the rib portions is so located that, as seen along the first direction, the second portion overlaps with at least one of (a) width decreasing areas and (b) any portion or portions that are located to the back-face side of the width decreasing areas, of the lower level article. This makes it easier to make the vertical dimension of the back-face side end portion of each rib portion sufficiently large for the corresponding shelf row to have proper strength for supporting articles, compared with a case in which the second portion is so located that no part of the second portion overlaps with the lower level article. Note that a portion of the second portion that overlaps with a lower level article is located in a space across which outer surfaces (of two lower level articles that are adjacent to each other along the first direction) are located from each other along the first direction. However, the separation distance, along the first direction, between the two width decreasing areas (and the portion or portions on a back-face side of the width decreasing areas) of two lower level articles that are adjacent each other along the first direction is greater than the separation distance between the two mutually-facing maximum width areas of such two lower level articles. Therefore, even when a second portion is located in such a space, the separation distance, along the first direction, between the two mutually-facing maximum width areas of two lower level articles that are adjacent to each other along the first direction can be kept small while properly securing the separation distance between any outer surface of a lower level article and a second portion.

As such, an article support rack is provided for which the article storage efficiency can be improved while properly maintaining article supporting strength of the rack portions.

Additional features and advantages of the article support rack will be made apparent from the following description of the embodiments given with reference to the attached drawings.

DETAILED DESCRIPTION

Embodiments of an article support rack are described next with reference to the attached drawings. In the present embodiment, an example is described in which an article support rack in accordance with the present disclosure is used in an article storage facility in which a transport device places articles in, and retrieves articles from, the article support rack.

Figure 1:
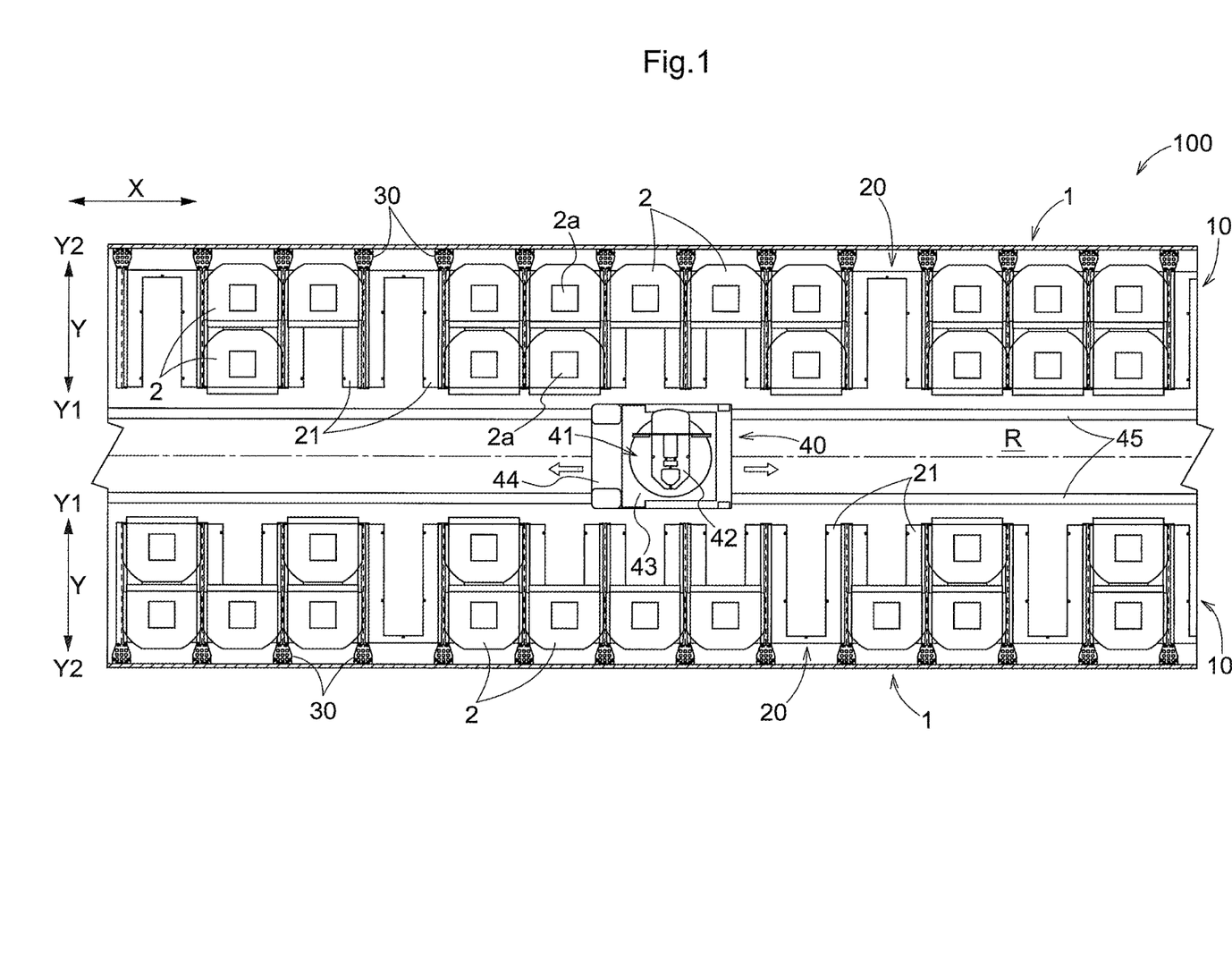
FIG. 1 is a plan view of a portion of an article storage facility.

As shown in FIG. 1, the article storage facility 100 includes article support racks 1 each having rack portions 10 each configured to support articles 2, and a transport device 40 configured to transport articles 2, one at a time, to or from any of the rack portions 10. Each rack portion (a portion of a rack) 10 is configured to support a plurality of articles 2 with the articles 2 arranged one adjacent to another along a first direction X parallel to a horizontal plane. In the present embodiment, each rack portion 10 is further configured to support a plurality of articles 2 (two articles 2 in the present example) adjacent each other along a second direction Y which is perpendicular to the first direction X in plan view (as seen along a vertical direction Z). The second direction intersects the first direction X at a right angle in a horizontal plane, in the present example. The transport device 40 travels along (i.e., parallel to) the first direction X and along a travel path R parallel to the front faces of the article support racks 1 to transport articles 2 one article 2 at a time. The travel path R is located so that it is adjacent to a front-face side Y1 of each article support rack 1 where the front-face side Y1 is one direction or side along (i.e., parallel to) the second direction Y. In other words, each article support rack 1 is located on the back-face side Y2 of, and adjacent to, the travel path R where the back-face side Y2 is one direction or side along the second direction Y that is opposite from the front-face side Y1. Therefore, each article support rack 1 has a front-face side direction Y1 and a back-face side direction Y2 defined with respect to that article support rack 1 with the front-face side direction Y1 being a direction along the second direction Y that points toward the travel path R as seen along a vertical direction Z and the back-face side direction Y2 being a direction along the second direction Y that points away from the travel path R as seen along a vertical direction Z. And the expression "front-face side Y1" is used to refer to the side corresponding to the front-face side direction Y1 and the expression "back-face side Y2" is used to refer to the side corresponding to the front-face side direction Y1. In the present embodiment, a pair of article support racks 1 are installed such that they face each other along the second direction Y with the travel path R located therebetween. A transfer device 41 provided to the transport device 40 and configured to transfer an article 2 between the transport device 40 and a rack portion 10 is configured to be capable of transferring an article 2 to any of the rack portions 10 of either of the article support rack 1 of the pair.

Figure 2:
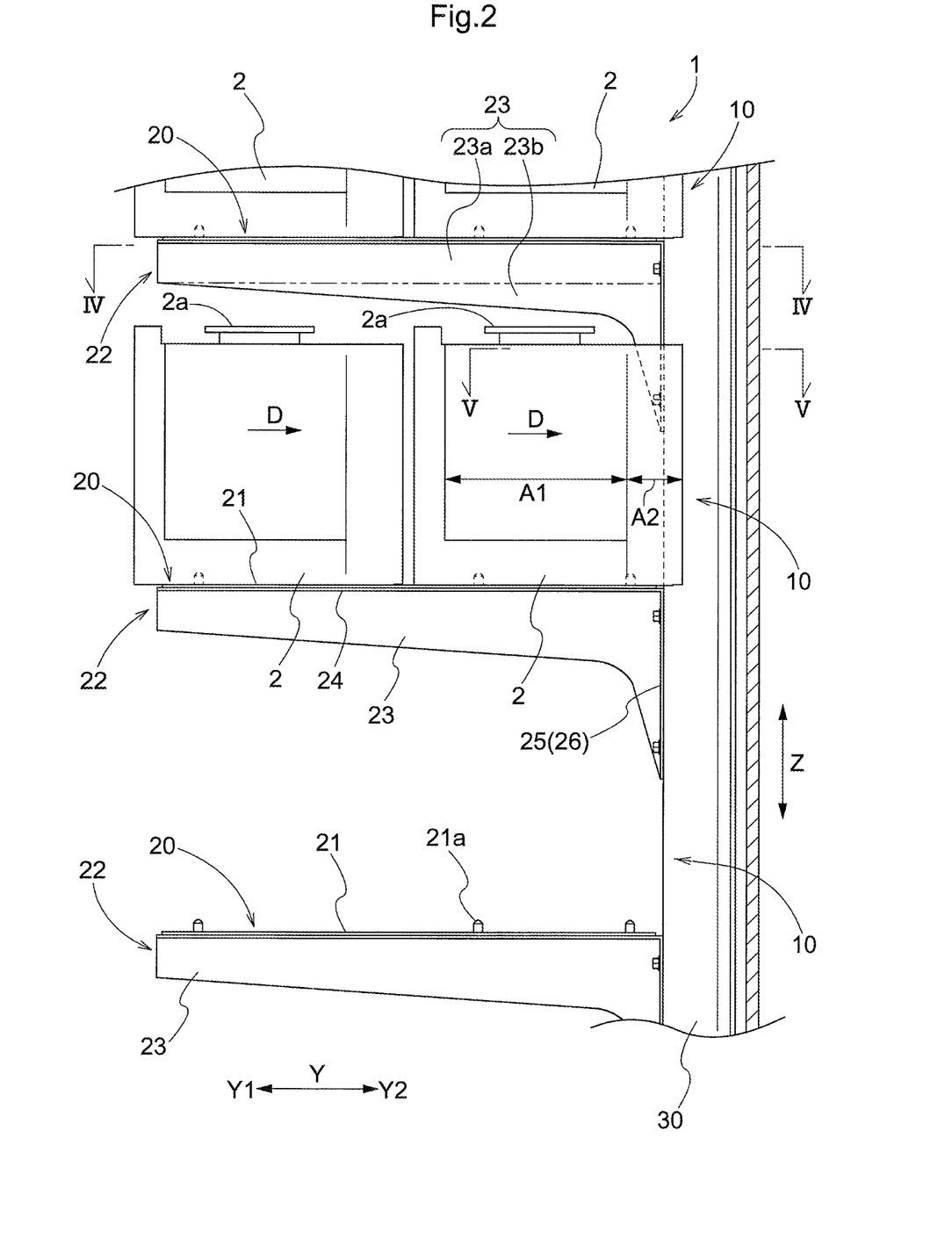
FIG. 2 is a side view of a rack portion.
Figure 3:
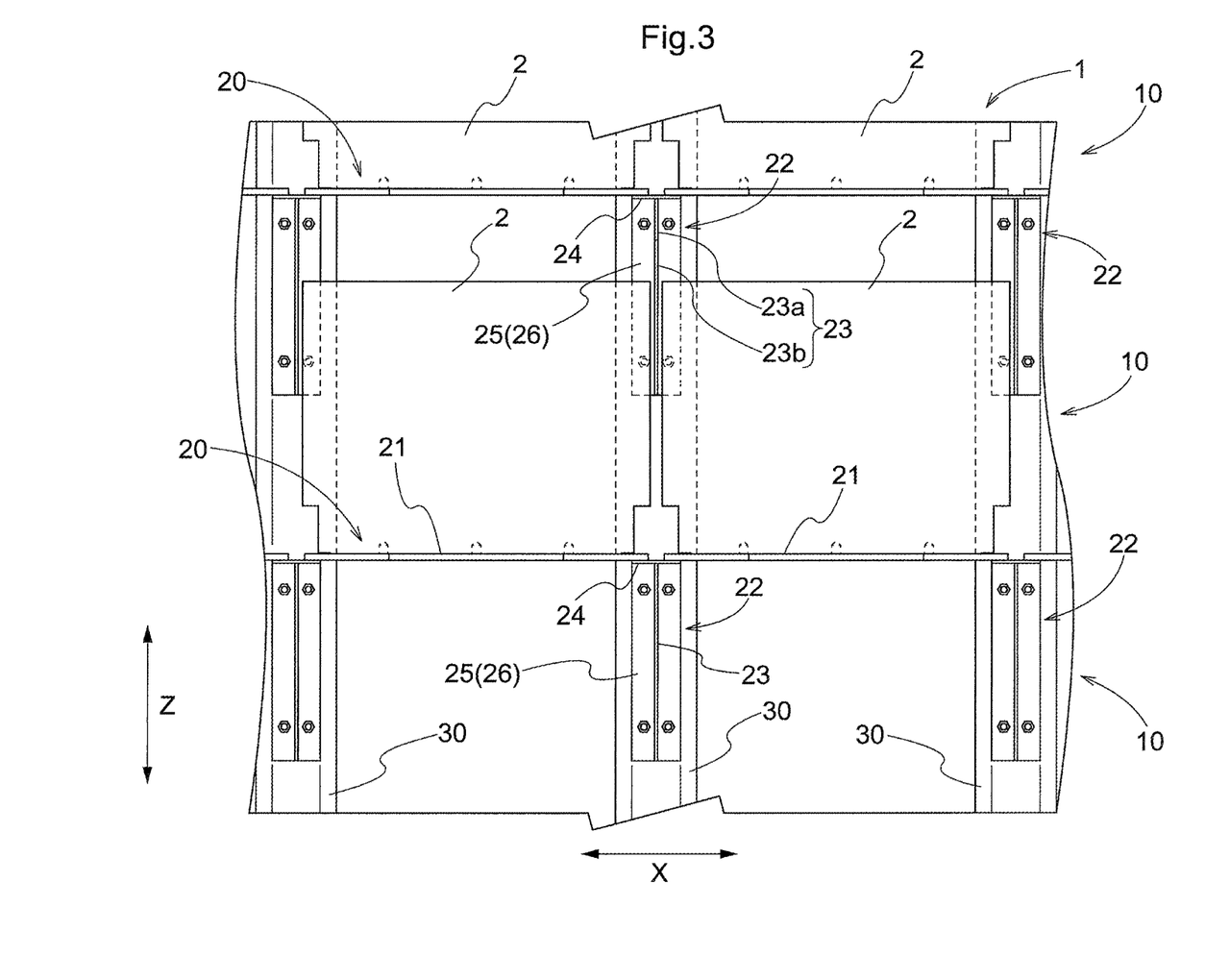
FIG. 3 is a front view of a rack portion.

As shown in FIGS. 2 and 3, each article support rack 1 has a plurality of levels of rack portions 10 so that the rack portions 10 are arranged one rack portion over another along the vertical direction Z. Each rack portion 10 includes a shelf row 20 described below as well as spaces (above the shelf row 20) to be occupied by articles 2 when supported by the shelf row 20. The word "over" in the expression "the rack portions 10 are arranged one rack portion over another" means "above" with overlapping allowed between a rack portion 10 and another rack portion 10 immediately above it as seen along the first direction X. In other words, each article support rack 1 is configured to support articles 2 at each of a plurality of levels (i.e., levels of the article support rack 1) arranged one above another along the vertical direction Z. In the present embodiment, the transport device 40 is a stacker crane. More specifically, as shown in FIG. 1, the transport device 40 includes a travel carriage 44 capable of traveling along the first direction X while being guided by a rail 45 installed on the floor, and a vertically movable member 43 configured to be capable of being moved (i.e., raised and lowered) along the vertical direction Z while being guided by a mast arranged vertically on the travel carriage 44. The transfer device 41 is supported by the vertically movable member 43. An article 2 is transferred between the transport device 40 and a rack portion 10 that is the target of a transport operation (transfer target) by the transfer device 41 with the vertically movable member 43 being raised or lowered to a height corresponding to that rack portion 10. In the present embodiment, the transfer device 41 has a support member 42 which is configured to support an article 2 from below and which can be projected and retracted along the second direction Y. And the vertically movable member 43 is vertically moved with the support member 42 projected toward the rack portion 10. This allows the article 2 to be transferred between the transport device 40 (more specifically, the support member 42) and a rack portion 10.

The transport device 40 performs transport operations of articles 2 based on control signals it receives from a controller (not shown) provided to the article storage facility 100. The transport operations for transporting articles 2 performed by the transport device 40 include a storing transport operation by which an article 2 is transported to a rack portion 10 of an article support rack 1, and a retrieving transport operation by which an article 2 is transported from a rack portion 10 of an article support rack 1. The article 2 that has been carried into an article support rack 1 by a storing transport operation is stored in the article support rack 1 with the article supported by a rack portion 10 until the article 2 is taken out of, or retrieved from, the article support rack 1 by a retrieving transport operation.

As shown in FIGS. 2 and 3, each article support rack 1 has shelf rows 20 each of which is provided to the rack portion 10 of the corresponding level to support articles 2 from below, and shelf support members 30 which support the shelf rows 20. Each shelf row 20 includes fastened portions 26 which are fastened to the shelf support members 30. Each shelf row 20 is supported in a cantilever fashion by the shelf support members 30 from the back-face side Y2, which means that the shelf support members 30 supporting the shelf row 20 are located on the back-face side Y2 (along the second direction Y) of the shelf row 20. In the present embodiment, each shelf support member 30 is a support column (vertical frame member) installed on the floor such that it extends along the vertical direction Z. As shown in FIG. 1, a plurality of shelf support members 30 are so arranged that they are parallel to each other and spaced apart from each other along the first direction X. The shelf row 20 of the rack portion 10 of each level is supported by a plurality of shelf support members 30 arranged to be spaced apart from each other along the first direction X. In the present embodiment, one rack portion 10 is provided for each level of the article support rack 1, and one shelf row 20 is provided to each rack portion 10. And each shelf row 20 is supported by a plurality (fourteen in the example shown in FIG. 1) of shelf support members 30.

Figure 4:
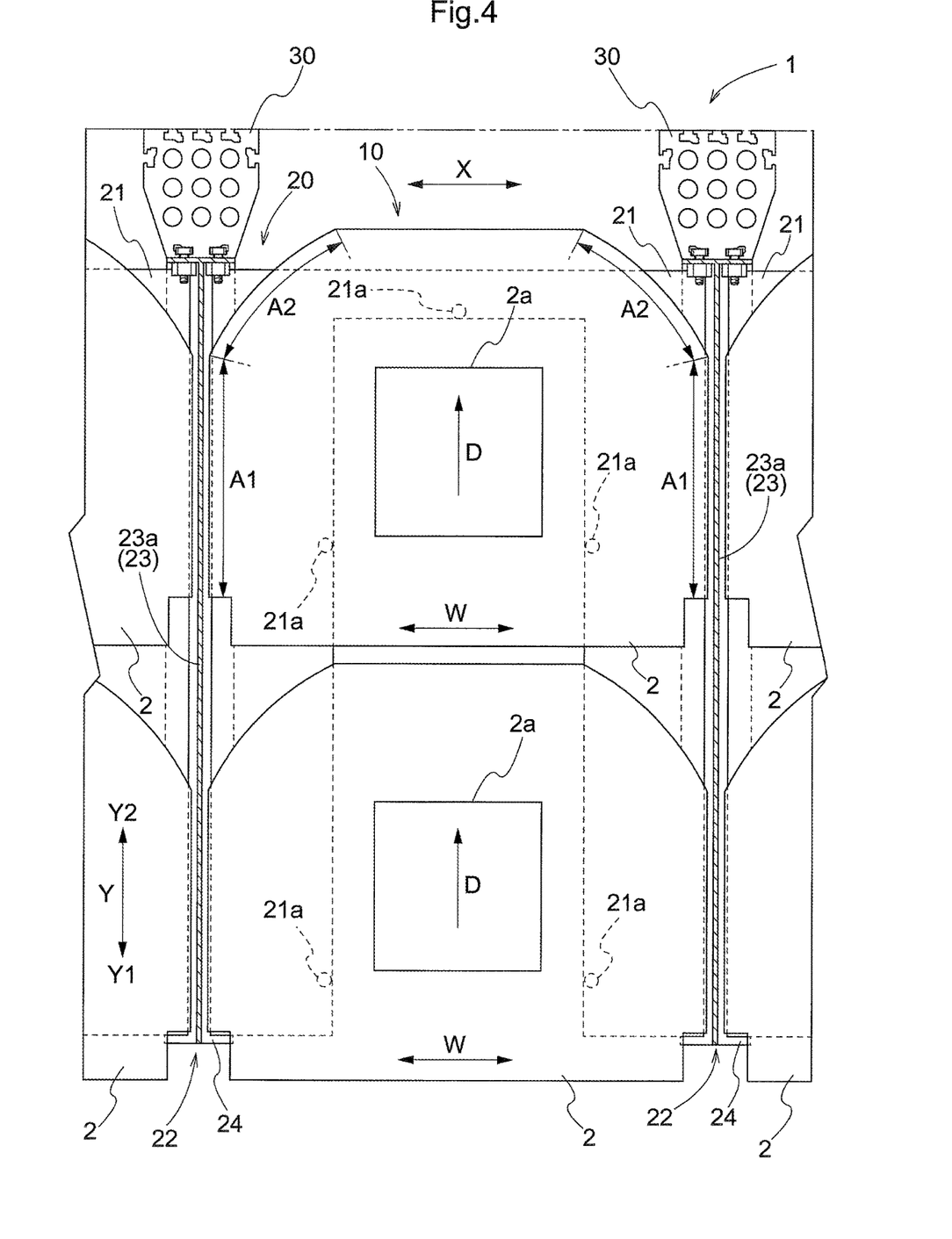
FIG. 4 is a sectional view taken at IV-IV in FIG. 2.

Each shelf row 20 has shelf main body portions 21 (or simply, main body portions 21) each of which is plate-shaped and is parallel to a horizontal plane where "plate-shaped" means generally flat and thin (thickness is less than width and length). Thus, in the present embodiment, each "shelf row" includes, among other things (such as brackets 23) described herein as being parts or portions of a shelf row, a collection of such main body portions 21 that are at, or belong to, the same level. Each main body portion 21 is configured to contact and support an article 2 from below. In other words, as a result of an article 2 being contacted and supported from below by a main body portion 21, such an article 2 is supported from below by a shelf row 20 that has that main body portion 21 as a part thereof. In the present embodiment, as described above, an article 2 is transferred between the transport device 40 (more specifically, the support member 42) and a rack portion 10 by vertically moving the vertically movable member 43 with the support member 42 projected toward the rack portion 10. For this reason, a cut-out portion (a rectangular cut-out portion in the present example) is formed in each main body portion 21 for allowing the support member 42 to pass by or through the main body portion 21 along the vertical direction Z. That is, the main body portion 21 is generally formed in a shape of a "U" (more specifically "U" with right-angle corners) that opens toward the front-face side Y1 as seen along the vertical direction Z. In the present embodiment, as shown in FIGS. 3 and 4, each main body portion 21 is configured to be capable of supporting only one article 2 at one location along the second direction Y. And each shelf row 20 includes a plurality of main body portions 21 arranged one adjacent to another along the first direction X. As such, in the present embodiment, the rack portion 10 of each level can support articles 2 with as many as the same number of articles 2 arranged one adjacent to another along the first direction X as the number of main body portions 21 of the shelf row 20 provided to that rack portion 10. In addition, as shown in FIGS. 1, 2 and 4, in the present embodiment, each main body portion 21 is configured to be capable of supporting two articles arranged one adjacent to another along the second direction Y.

In addition to the main body portions 21, each shelf row 20 includes brackets 22 which support the main body portions 21 from below with each bracket 22 attached to the corresponding shelf support member 30. As shown in FIGS. 3 and 4, each shelf row 20 is provided with a plurality of brackets 22 spaced apart from each other along the first direction X. As shown in FIG. 2, each bracket 22 is attached to a shelf support member 30 such that it projects in the front-face side direction Y1 from the shelf support member 30. Each main body portion 21 is fixed to a pair of brackets 22 so as to be supported from below by portions of the pair of brackets 22 that project in the front-side direction Y1 from corresponding shelf support members 30. The fastened portion 26 described above used to fix a shelf row 20 to a shelf support member 30 is a part of a bracket 22 (more specifically a back-side Y2 end portion of a bracket 22) as in the present example or may be fixed to the back-side Y2 end portion of the bracket 22. The main body portions 21 are supported by the shelf support members 30 in a cantilever fashion from the back-face side Y2 as a result of the main body portions 21 being fixed to the brackets 22.

Each bracket 22 has a rib portion 23. As shown in FIG. 2, the rib portion 23 is formed to project downward with respect to a corresponding main body portion 21 and to extend in the front-face side direction Y1 from the corresponding shelf support member 30. As shown in FIG. 4, each rib portion 23 is formed to extend in the front-face side direction Y1 from the shelf support member 30 and parallel to the second direction Y. In addition, the width of each rib portion 23 along the first direction X is formed to be less than the dimension of the rib portion 23 along the vertical direction Z. In other words, each rib portion 23 is formed to be plate-shaped (i.e., generally flat and thin (thickness is less than length and width)) and is oriented parallel to a vertical plane (an imaginary vertical plane normal to the first direction X). As such, each shelf row 20 includes the main body portions 21 and the rib portions 23. And, in the present embodiment, each rib portion 23 is formed as a part of a bracket 22 provided to a shelf row 20 in addition to the main body portions 21.

Figure 6:
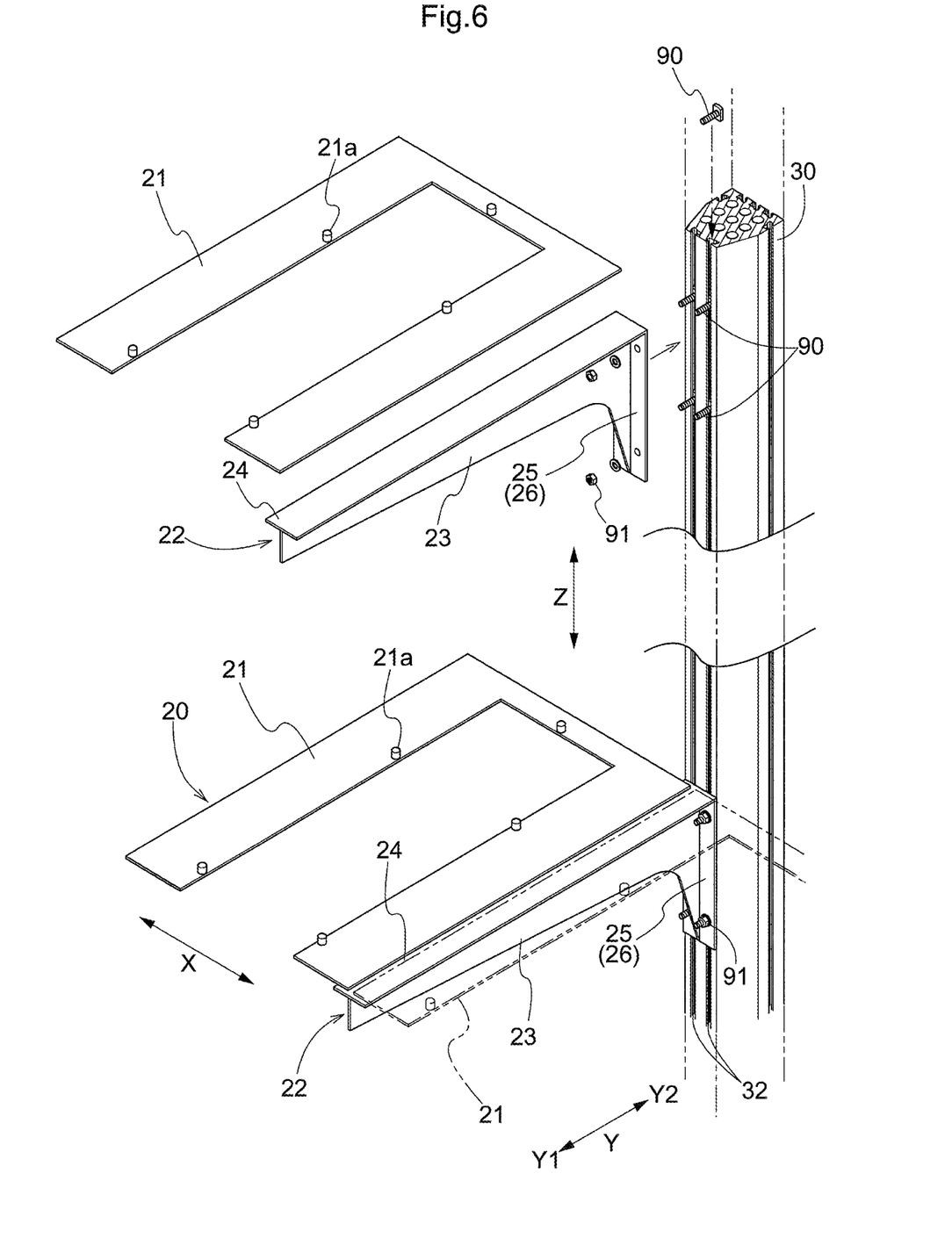
FIG. 6 is an exploded perspective view showing how a shelf row is attached to a shelf support member.

Each bracket 22 has an upper-face-side plate-shaped portion 24 which is plate-shaped (i.e., generally flat and thin (thickness is less than length and width)), oriented parallel to a horizontal plane, and is connected to the upper end of the rib portion 23. As shown in FIGS. 3 and 6, each upper-face-side plate-shaped portion 24 has a width along the first direction X that is greater than that of the rib portion 23. And the upper end portion of the rib 23 is connected to an intermediate portion (a center portion in the present embodiment) along the first direction X of a bottom surface of the upper-face-side plate-shaped portion 24. In the present embodiment, each upper-face-side plate-shaped portion 24 is so formed that the width thereof along the first direction X remain unchanged (over its entire length) along the second direction Y. Each main body portion 21 is fixed to a pair of brackets 22 with the main body portion 21 in contact with the upper-face-side plate-shaped portions 24 of the pair of brackets 22. Each main body portion 21 is fixed to a pair of brackets 22 (the upper-face-side plate-shaped portions 24) by means of fasteners such as screws or rivets or by welding, for example.

As shown in FIGS. 3 and 4, the edge portion of each main body portion 21 that is on one side (hereinafter a "first side") along the first direction X is fixed to a bracket 22 (referred to as the first bracket 22) such that the edge portion is in contact, from above, with a portion of the upper-face-side plate-shaped portion 24 of the first bracket 22 that is on the side (referred to as the second side) opposite from the first side with respect to the center, along the first direction X, of the first bracket 22. In addition, an edge portion of each main body portion 21 that is on the second side is fixed to a bracket 22 (referred to as the second bracket 22) that is adjacent to, and located to the second side of, the first bracket 22 such that the edge portion is in contact, from above, with a portion of the upper-face-side plate-shaped portion 24 of the second bracket 22 that is on the first side with respect to the center, along the first direction X, of the second bracket 22. That is, each edge of each main body portion 21 (that is an end thereof along the first direction X) is supported by corresponding one of a pair of brackets 22 (a first bracket and a second bracket) that are spaced apart from each other along the first direction X.

Figure 5:
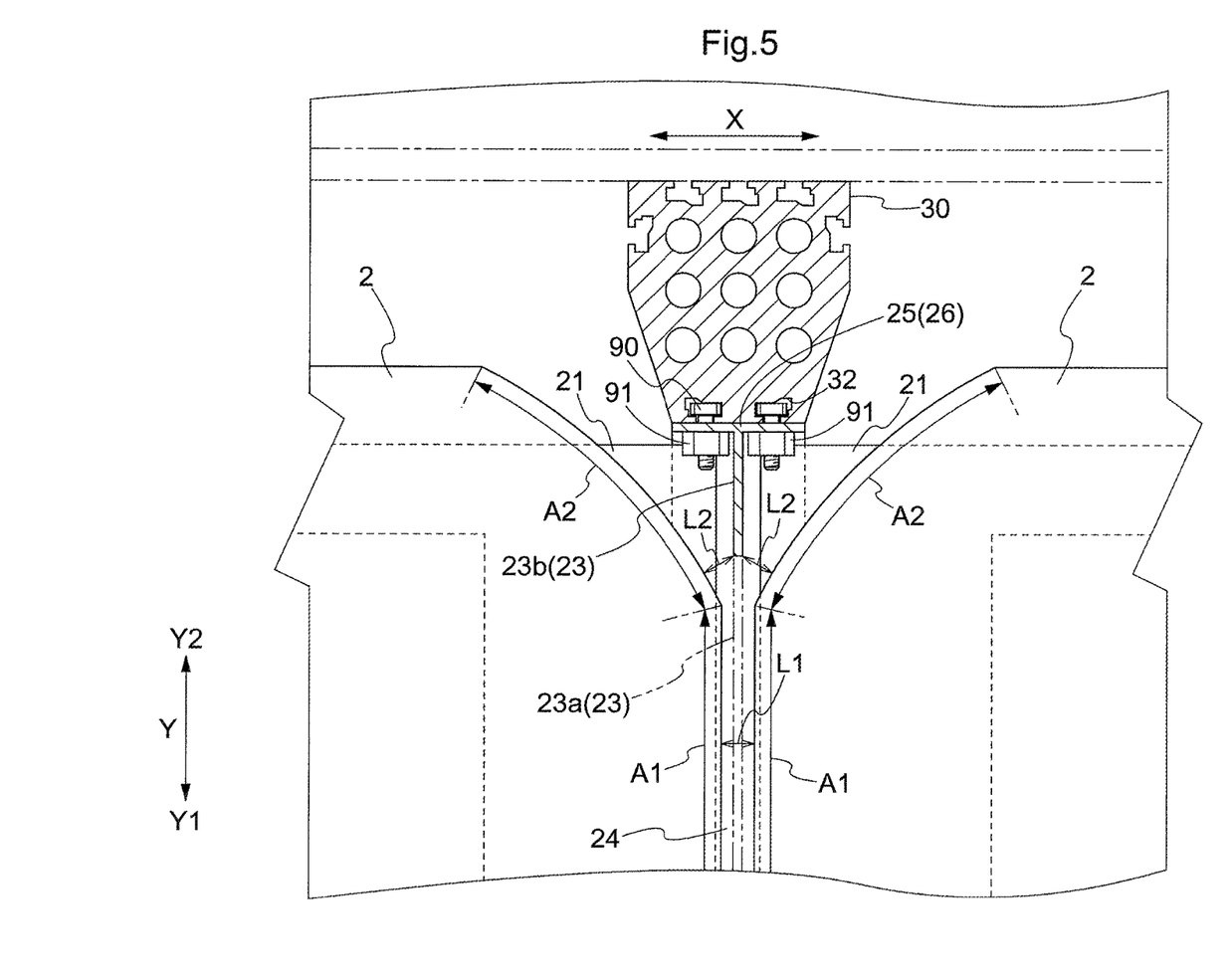
FIG. 5 is a sectional view taken at V-V in FIG. 2.

As shown in FIGS. 2 and 6, each bracket 22 has a back-face-side plate-shaped portion 25 which is parallel to a vertical plane (an imaginary vertical plane normal to the second direction Y) and is connected to the end portion, on the back-face side Y2, of the rib portion 23. As shown in FIGS. 3 and 5, the back-face-side plate-shaped portion 25 is formed such that its width along the first direction X is greater than that of the rib portion 23. And an end portion, on the back-face side Y2, of the rib portion 23 is connected to an intermediate portion (central portion in the present embodiment), along the first direction X, of the surface (of the back-face-side plate-shaped portion 25) that is on the front-face side Y1. In the present embodiment, each back-face-side plate-shaped portion 25 is so formed that its width along the first direction X remains unchanged (over its entire length) along the vertical direction Z. Each back-face-side plate-shaped portion 25 is fixed to a shelf support member 30 with the back-face-side plate-shaped portion 25 in contact with the shelf support member 30 from the front-face side Y1. In other words, in the present embodiment, the back-face-side plate-shaped portion 25 is used as a fastened portion 26 described above which is used to fix a shelf row 20 to a shelf support member 30.

In the present embodiment, each back-face-side plate-shaped portion 25 is fixed to the corresponding shelf support member 30 by means of fastening bolts 90. More specifically, as shown in FIGS. 5 and 6, grooves 32 (recessed grooves) recessed toward the back-face side Y2 are formed in one side portion (of each shelf support member 30) that is on the front-face side Y1 such that each groove 32 extends along the vertical direction Z. Each groove 32 is so formed that the opening of the groove 32 is formed in an outer surface (an end surface facing the front-face side Y1 of the corresponding shelf support member 30) that is in contact with a back-face-side plate-shaped portion 25. In addition, the shape of the cross-section of each groove 32 taken perpendicular to the vertical direction Z remains unchanged along the vertical direction Z. In the present embodiment, two grooves 32 are formed in each shelf support member 30 such that they extend parallel to each other and are spaced apart from each other along the first direction X. Each groove 32 forms a space into which a portion (of the fastening bolt 90) including the head (more specifically, a portion that includes the entire head and a portion of the body (or the shaft portion) of the bolt 90 close to the head) can be inserted along the vertical direction Z, with the bolt 90 in such an orientation that its body is located on the front-face side Y1 with respect to its head. The width, along the first direction X, of the portion of the groove 32 in which a portion of the body (or the shaft portion) of the fastening bolt 90 is inserted (i.e., the width of the opening of the groove 32 on the front-face side Y1) is less than the width, along the first direction X, of the head of the fastening bolt 90 when it is in the groove 32. Therefore, each fastening bolt 90 with a portion including the head inserted in a groove 32 can be moved along the vertical direction along which the groove 32 extends, with its head being prevented from coming out of the groove 32 toward the front-face side Y1 (i.e., with any movement of the fastening bolt 90 toward the front-face side Y1 being prevented).

With a portion including the head of a fastening bolt 90 inserted in a groove 32, a portion including the distal end (the end on the opposite side from the head) of the body (or the shaft portion) of each fastening bolt 90 is outside the groove 32 (on the front-face side Y1 of the groove 32). Through holes into each of which the body of a fastening bolt 90 is inserted from the back-face side Y2 are formed in each back-face-side plate-shaped portion 25 such that the through holes extend through the back-face-side plate-shaped portion 25 along the second direction Y. And, each back-face-side plate-shaped portion 25 is fastened to a shelf support member 30 by having a nut 91 in threaded engagement with a threaded portion of the body of each fastening bolt 90 with the back-face-side plate-shaped portion 25 being so positioned with respect to the shelf support member 30 that the body of each fastening bolt 90 extends through the corresponding through hole. Note that, in the present embodiment, the "contact portions" of an outer surface (a surface facing the front-face side Y1) of each shelf support member 30 that are in contact with back-face-side plate-shaped portions 25 and the "non-contact portions" (each of which is a portion that is next to a contact portion along the vertical direction Z) of an outer surface (a surface facing the front-face side Y1) of each shelf support member 30 that are not in contact with any back-face-side plate-shaped portion 25 are located at the same position along the second direction Y.

In the present embodiment, each back-face-side plate-shaped portion 25 is fastened to a shelf support member 30 by means of four fastening bolts 90. In addition, used as fastening bolts 90 in the present embodiment are T-bolts each of which has a head that is rectangular in shape which has a pair of longer sides and a pair of shorter sides as seen along a direction parallel to the axis of the fastening bolt 90 (i.e. along a direction along which the body of the fastening bolt 90 extends). The head of each fastening bolt 90 is inserted in the corresponding groove 32 in such an orientation that the shorter sides of the rectangle extend along the first direction X while the longer sides of the rectangle extend along the vertical direction Z. And the width, along the first direction X, of the portion of each groove 32 in which the head of a fastening bolt 90 is inserted is set to be greater (slightly greater in the present example) than the length of the shorter sides of the rectangle and is less than the length of the diagonal line (an imaginary line connecting two opposite angles) of the rectangle (and is less than the length of the longer sides of the rectangle in the present example). Therefore, with the head of a fastening bolt 90 inserted in a groove 32, any rotation of the fastening bolt 90 of about an axis of the body of the fastening bolt 90 is restricted or prevented by the groove 32. That is, each fastening bolt 90 is prevented from rotating. This makes easier to have each nut 91 to threadingly engage the threaded portion of the body of the corresponding fastening bolts 90 when attaching the brackets 22 to corresponding shelf support members 30.

As described above, a shelf row 20 provided to a rack portion 10 of the corresponding level of the article support rack 1 has rib portions 23 in addition to the main body portions 21 each of which is configured to (contact and) support an article 2 from below. By providing such rib portions 23, each shelf row 20 supported by the shelf support members 30 in a cantilever fashion (i.e., with the shelf supporting members 30 supporting the shelf row 20 being located on one side) can be made stronger against the bending moment applied to it, which makes it possible to maintain proper structural strength of each shelf row 20 for supporting articles 2. In addition, it is desirable that such rib portions 23 be provided in a way that would not lower article storage efficiency of the article support rack 1. Arrangement and locations of the rib portions 23 that make it possible to reduce any lowering of article storage efficiency of the article support rack 1 are described next.

As shown in FIG. 4, outer surfaces of each article 2 supported by an article support rack 1 include maximum width areas A1 in and over which the dimension along the lateral width direction W, or the width, of the article 2 is greatest, and width decreasing areas A2 in and over which the dimension along the lateral width direction W, or the width, of the article 2 decreases in a depth direction D which is perpendicular to the lateral width direction W (i.e., decreases toward the depth direction D side end face of the article 2 as seen along the vertical direction Z). Here, the lateral width direction W and the depth direction D are directions associated with each article 2 and parallel to a horizontal plane. That is, the outer surfaces of an article 2 here mean the outer surfaces that form the perimeter of the article 2 as seen in plan view (along a vertical direction Z). In addition, the depth direction D points in one direction (i.e., from the front (where the opening is) of the article 2 toward its back). Note that the expression "the dimension along the lateral width direction W, or the width, of an article 2 is greatest" means that the dimension along the lateral width direction W, or the width, of the article 2 falls within a range whose upper limit is the greatest value and whose lower limit is a preset value that is less than or equal to the greatest value. This preset value may be set to be equal to the maximum value, or to a value less than the maximum value (for example, a value that is 95% of the maximum value).

In the example shown in FIG. 4, each maximum width area A1 extends from one side with respect to a central area of the article 2 along the depth direction D to the other side with respect to the central area of the article 2 along the depth direction D, and through the central area. In addition, each width decreasing area A2 is formed between an end or edge portion, on the depth direction D side, of the corresponding maximum width area A1 and an end portion or surface, on the depth direction D side, of the article 2. And each article 2 is supported by a shelf row 20 (more specifically, a main body portion 21) in an orientation in which its depth direction D points, or is directed, toward the back-face side Y2 (i.e., points in the back-face side direction Y2). That is, the transport device 40 controls the transfer operation of an article 2 by the transfer device 41 such that the article 2 ends up being supported by a shelf row 20 (i.e., a main body portion 21 thereof) in an orientation in which its depth direction D points, or is directed, toward the back-face side Y2 (i.e., is directed in the back-face side direction Y2).

In the present embodiment, each article 2 is a container configured to hold one or more semiconductor substrates, and is, more specifically, a FOUP (Front Opening Unified Pod). Without providing a detailed description, each article 2 is provided with a lid, at the opposite side from the depth direction D side, for closing and leaving open an opening for inserting and retrieving one or more substrates from the container. In addition, formed in the bottom surface of each article 2 are recessed portions for engagement with positioning or kinematic pins 21a formed, or otherwise provided to, each main body portion 21. Each article 2 is supported by a main body portion 21 with the article properly positioned with respect to the main body portion 21 as a result of the pins 21a engaging the recessed portions. In addition, a flange portion 2a to be held by a transport device, such as a ceiling or overhead transport vehicle, is formed on, or otherwise provided to, the top surface of each article 2. The flange portion 2a is located between (i.e., does not extend beyond in plan view) two end surfaces, along both the width direction W and the depth direction D, of a portion (the main body portion) of the article 2 that defines a space for holding one or more semiconductor substrates. The maximum width areas A1 and the width decreasing areas A2 described above are areas in the outer surfaces of the main body portion of an article 2 (i.e., of a portion of an article 2 that does not include at least the flange portion 2a). In addition, an example of part(s) or portion(s) (other than the flange portion 2a) which the main body portion of the article 2 does not include is handles which may be fixed to sides of the article 2.

As shown in FIG. 2, each rib portion 23 has a first portion 23a which is located higher than an article 2 (referred to as the "lower level article") supported by a shelf row 20 (referred to as the "lower level shelf row") that is one level lower than the shelf row 20 of which the rib portion 23 is a part or portion, and a second portion 23b which is located lower than the first portion 23a. In the present embodiment, as one example, the height of the lowest point along the end vertical edge, on the front-face side Y1, (or the front-face side end vertical edge) of the rib portion 23 may be defined as a reference height. And the portion (of the rib portion 23) above the reference height is the first portion 23a whereas the portion (of the rib portion 23) located below the reference height is the second portion 23a.

As shown in FIG. 4, each rib portion 23 is located between, in plan view, two articles 2 (two lower level articles) that are supported by the lower level shelf row and adjacent to each other along the first direction X. And, as shown in FIG. 2, each second portion 23b is so located that it does not overlap with the maximum width areas A1 of a lower level article as seen along the first direction X. Since the maximum width areas A1 are areas of the outer surfaces of a portion of an article 2 that does not include at least the flange portion 2a as described above, the second portion 23b may be so located that it overlaps with the flange portion 2a of a lower level article as seen along the first direction X. In the present embodiment, however, the second portion 23b is so located that it does not overlap with the flange portion 2a of a lower level article as seen along the first direction X. In addition, each second portion 23b is so located that, as seen along the first direction X, it overlaps with at least one of (a) width decreasing areas A2 and (b) any portion or portions that are located to the back-face side Y2 of the width decreasing areas A2, of a lower level article (a lower level article that is at a location furthest in the back-face side direction Y2 (i.e., location closest to the back side of the article support rack 1) in case each shelf row 20 can support a plurality of articles 2 placed adjacent to each other along the second direction Y as in the present embodiment). In the present embodiment, the end portions, on the depth direction D side, of the width decreasing areas A2 coincide with the end portion, on the depth direction D side, of each article 2; thus, each second portion 23b is so located that it overlaps with the width decreasing areas A2 of a lower level article as seen along the first direction X.

By so locating each rib portion 23, as shown in FIGS. 2 and 5, neither the first portion 23a of a rib portion 23 nor the second portion 23b of the rib portion 23 is located in a space across which two maximum width areas A1 (of two articles 2 that are supported by a shelf row 20 and are adjacent to each other along the first direction X) face each other along the first direction X. Note that FIG. 5 shows only simplified lines representing outlines (i.e., the perimeters) of two adjacent articles 2. As a result, as shown in FIG. 5, the distance of separation (referred to as the first separation distance L1) between two articles 2 that are supported by a shelf row 20 and are adjacent to each other along the first direction X with the first separation distance L2 measured in the maximum width areas A1 can be made smaller compared with such a distance when a rib portion 23 is located in the space across which the two maximum width areas A1 face each other, thus allowing the article storage efficiency of the article support rack 1 to be maintained at a high level. Note that the first separation distance L1 may be set to be equal to (or alternatively a value that depends on), for example, a minimum required distance (referred to as a required separation distance) between a FOUP and other object (such as, another FOUP, a support pillar, or a supporting wall, etc.) as specified by SEMI (Semiconductor Equipment and Materials International) standards. This required separation distance is set depending on, among other factors, a transfer accuracy with which a FOUP is transferred by the transfer device.

On the other hand, as shown in FIGS. 2 and 5, the second portion 23b of a rib portion 23 is located in a space across which two width decreasing areas A2 (of two articles 2 (that are located in locations furthest in the back-face side direction Y2) that are supported by a shelf row 20 and are adjacent to each other along the first direction X) are located from each other along the first direction X. However, in the width decreasing areas A2, the separation distance, along the first direction X, between these two articles 2 is greater than the separation distance between the maximum width areas A1. Thus, even if the second portion 23b of a rib portion 23 is located in a space across which two width decreasing areas A2 of two articles 2 are located from each other along the first direction X, the first separation distance L1 described above can be made small while maintaining the separation distance (second separation distance L2) between the second portion 23b and each outer surface of each article 2 to be greater than or equal to a set value or a set distance. Thus, the second portion 23b is so located that it is spaced apart from any outer surface, in the width decreasing area A2, of each article 2 by a distance greater than or equal to the set value or set distance. This set value or the set distance may be set, for example, to the required separation distance specified by the SEMI standards as described above.

Thus, the second portion 23b can be located in the space across which two width decreasing areas A2 of two articles 2 (that are supported by a shelf row 20 and are adjacent to each other along the first direction X) are located from each other along the first direction X, a result of which is that, as shown in FIG. 2, the vertical dimension (dimension along the vertical direction Z) of the back-face side Y2 end portion of the rib portion 23 and the vertical dimension of the back-face-side plate-shaped portion 25 can be easily made sufficiently large for the shelf row 20 to have proper strength for supporting articles 2. Note that an example is shown in FIG. 2 in which the vertical dimension (dimension along the vertical direction Z) of the second portion 23b gradually and continuously increases toward its back-face side Y2 end. In other words, the lower end of the second portion 23b (lower end of the rib portion 23) is gradually and continuously lower toward the back-face side Y2 end. However, the vertical dimension of the second portion 23b may increase toward its back-face side Y2 end in a step-wise manner.

In addition, as described above, each rib portion 23 is located between, in plan view, two articles 2 (two lower level articles) that are supported by the lower level shelf row and adjacent to each other along the first direction X. This makes it possible for one rib portion 23 to be shared by two main body portions 21 that are adjacent to each other along the first direction X. This arrangement makes it possible to reduce the total number of the rib portions 23 in each shelf row 20 compared with a case in which two rib portions 23 are provided exclusively for each main body portion 21. Thus, this arrangement makes it possible to simplify the structure of the article support rack 1.

Other Embodiments

Other embodiments of an article support rack are described next.

(1) In the embodiment described above, an example is described in which the "contact portions" of an outer surface (a surface facing the front-face side Y1) of each shelf support member 30 that are in contact with back-face-side plate-shaped portions 25 and the "non-contact portions" of the outer surface (a surface facing the front-face side Y1) of each shelf support member 30 which are not in contact with any back-face-side plate-shaped portion 25 are located at the same position along the second direction Y. However, the invention is not limited to such an arrangement. The contact portions and the non-contact portions of each shelf support member 30 may be located at mutually different positions along the second direction Y. An example of such an arrangement is shown in FIG. 7.

Figure 7:
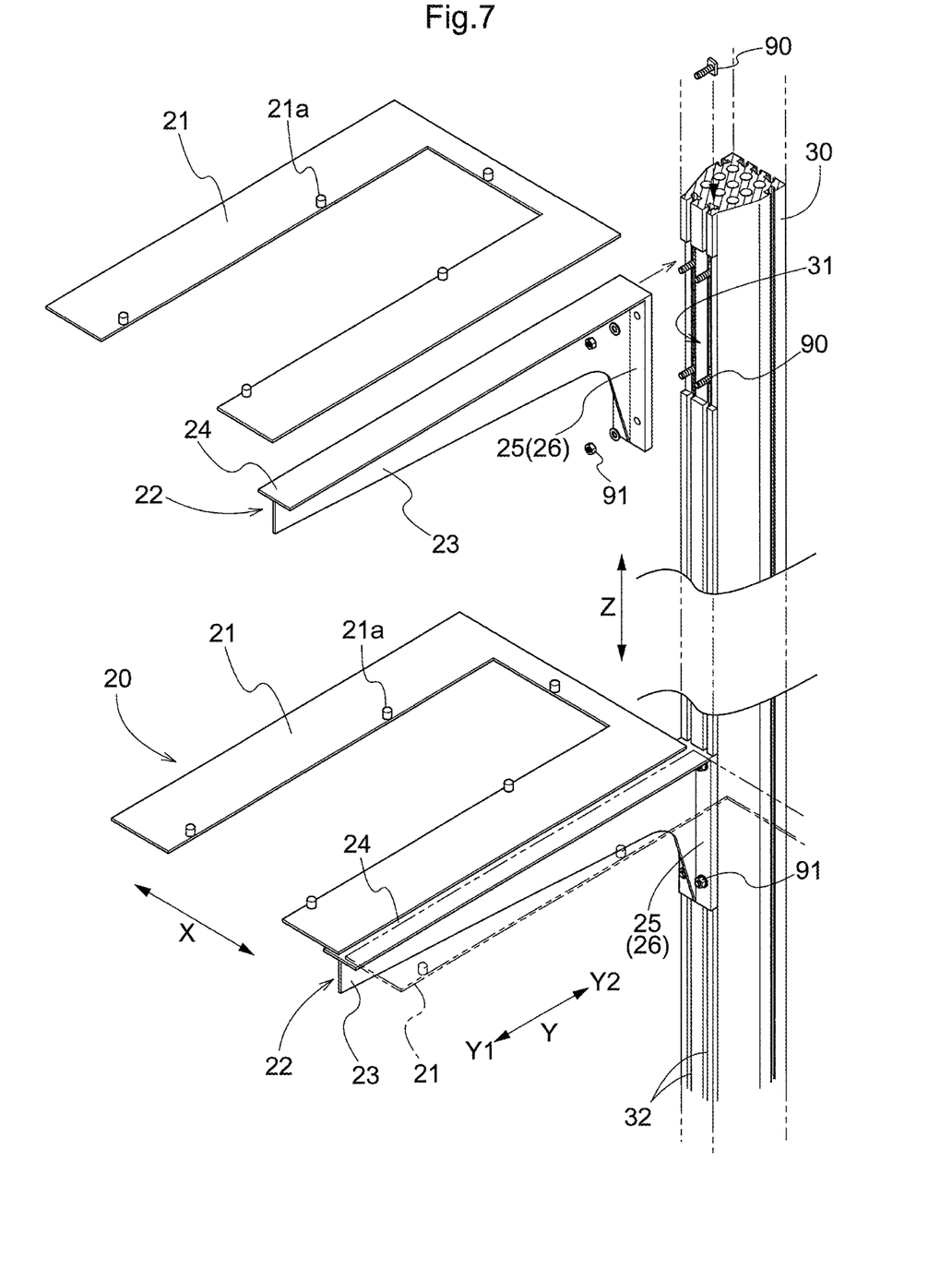
FIG. 7 is an exploded perspective view showing how a shelf row is attached to a shelf support member in another embodiment.

In the example shown in FIG. 7, each contact portion of a shelf support member 30 is located further to the back-face side Y2 than the non-contact portions of the shelf support member 30. In other words, in this example, a recessed portion, which is recessed in the back-face side direction Y2 with respect to the non-contact portions that are adjacent along the vertical direction Z, is formed as a fitting-engaged portion 31 (a portion into which a back-face-side plate-shaped portion 25 is fit) which includes a contact portion (of an outer surface of the shelf support member 30) with which a back-face-side plate-shaped portion 25 is in contact from the front-face side Y1. And each back-face-side plate-shaped portion 25 is fixed to the corresponding shelf support member 30 with the back-face-side plate-shaped portion 25 fit into the fitting-engaged portion 31. As described above, it is possible to adopt an arrangement in which each shelf support member 30 includes fitting-engaged portions 31 into which corresponding fastened portions 26 (back-face-side plate-shaped portions 25 in the present example) are fit. By adopting such arrangement in which the fastened portions 26 fit into corresponding fitting-engaged portions 31, it becomes easier to properly position the shelf rows 20 (more specifically the brackets 22) when attaching the shelf rows 20 (the brackets 22) to the shelf support members 30.

It is preferable that each fastened portion 26 is fit into the corresponding fitting-engaged portion 31 in such a way that would prevent any relative movement between them along at least the vertical direction Z. In the example shown in FIG. 7, each fastened portion 26 is fit into the corresponding fitting-engaged portion 31 such that any relative movement between them along at least the vertical direction Z is prevented. By adopting such an arrangement in which each fastened portion 26 is fit into the corresponding fitting-engaged portion 31 such that any relative movement between them along at least the vertical direction Z is prevented, each surface of fitting engagement between the fastened portion 26 and the fitting-engaged portion 31 can provide support against any bending moment that may act on the shelf row 20. In addition, the manner of the fitting engagement between a fastened portion 26 and corresponding fitting-engaged portion 31 (where "fitting engagement" between two members or portions means that one is fit into the other) may be changed suitably. For example, instead of the recessed portions (fitting-engaged portions 31) into which the fastened portions 26 are fit being formed in the shelf support members 30, a recessed portion into which a fitting-engaged portion 31 of each shelf support member 30 is fit into may be formed in each fastened portion 26.

(2) In the embodiment described above, an example is described in which the end portions, on the depth direction D side, of the width decreasing areas A2 coincide with the end portion, on the depth direction D side, of each article 2; thus, the second portion 23b of each bracket 23 is so located that it overlaps with the width decreasing areas A2 of a lower level article as seen along the first direction X. However, the invention is not limited to such an arrangement. The outer surfaces of an article 2 may have a portion or portions that are located to the depth direction D side than the width decreasing areas A2. The dimension of the article 2 along the width direction W in such a portion or portions may, for example, be constant. In such a case, each second portion 23b is so located that, as seen along the first direction X, it overlaps with at least one of (a) width decreasing areas A2 and (b) any portion or portions that are located to the back-face side Y2 of the width decreasing areas A2, of a lower level article.

(3) In the embodiment described above, an example is described in which each main body portion 21 is capable of supporting only one article 2 at a position along the second direction Y. However, the invention is not limited to such an arrangement. Each main body portion 21 may be so formed that it is capable of supporting a plurality of articles 2 at the same position along the second direction Y with these articles 2 arranged one adjacent to another along the first direction X. In other words, each shelf row 20 may include one or more main body portions 21.

(4) In the embodiment described above, an example is described in which each shelf row 20 includes the brackets 22 in addition to one or more main body portions 21 with each bracket 22 having a rib portion 23 formed therein. However, the invention is not limited to such an arrangement. Each rib portion 23 may instead be integrally formed with the corresponding main body portion 21. Or, each rib portion 23 as well as back-face-side plate-shaped portion 25 may be integrally formed with the corresponding main body portion 21.

(5) In the embodiment described above, an example is described in which the back-face-side plate-shaped portions 25 are used as fastened portions 26 to fix a shelf row 20 to the shelf support members 30. However, the invention is not limited to such an arrangement. The end portion, on the back-face side Y2, of each rib portion 23 may be used as a fastened portion 26. The end portion, on the back-face side Y2, of each main body portion 21 may be used as a fastened portion 26.

(6) In the embodiment described above, an example is described in which each shelf support member 30 is a support column installed on the floor such that it extends along the vertical direction Z. However, the invention is not limited to such an arrangement. Each shelf support member 30 may be a vertical support frame member fixed to the floor or the ceiling. Each shelf support member 30 may be a portion of a wall fixed to the floor.

(7) In the embodiment described above, an example is described in which the transfer device 41 has a support member 42 which is configured to support an article 2 from below and which can be projected and retracted along the second direction Y. And an article 2 is transferred between the transport device 40 and a rack portion 10 by vertically moving the vertically movable member 43 with the support member 42 projected toward the rack portion 10. However, the invention is not limited to such an arrangement. The transfer device 41 may instead have a gripping or holding portion which is configured to hold the flange portion 2a and which can be projected and retracted along the second direction Y. And an article 2 may be transferred between the transport device 40 and a rack portion 10 by vertically moving the vertically movable member 43 and by opening and closing the gripping or holding portion with the gripping or holding portion projected toward the rack portion 10.

(8) In the embodiment described above, an example is described in which each rack portion 10 can support articles 2 with two articles 2 arranged one adjacent to the other along the second direction Y. However, the invention is not limited to such an arrangement. Each rack portion 10 may be so constructed that it can support articles 2 with three or more articles 2 arranged one adjacent to another along the second direction Y. Or, each rack portion 10 may be so constructed that it can only support articles 2 with only one article 2 at a position along the first direction X.

(9) In the embodiment described above, an example is described in which a pair of article support racks 1 are installed such that they face each other along the second direction Y with the travel path R located therebetween. However, the invention is not limited to such an arrangement. Only article support rack 1 may be installed on one side, along the second direction Y, of the travel path R.

(10) In the embodiment described above, an example is described in which each article 2 is a FOUP configured to hold one or more semiconductor substrates. However, the invention is not limited to such an arrangement. One or more articles 2 may be containers each configured to hold things other than semiconductor substrates, such as, a container configured to hold one or more reticles. In addition, an article 2 may also be an object other than a container.

(11) In the embodiment described above, an example is described in which the transport device 40 is a stacker crane. However, the invention is not limited to such an arrangement. The transport device 40 may be a transport device other than a stacker crane, such as, among other possibilities, a transport device which can keep track of its own current position and can autonomously travel on the floor, one transport device provided for each level of the article support rack 1 so that each transport device can travel along a travel path R that is parallel to the first direction X and provided for the corresponding level, or a transport device (ceiling or overhead transport vehicle) which can travel along one or more rails installed to a ceiling side (above the floor) with the transport device supported by the one or more rails.

(12) In the embodiment described above, an example is described in which an article support rack in accordance with the present disclosure is used in an article storage facility in which a transport device places articles in, and retrieves articles from, the article support rack. However, the invention is not limited to such an arrangement. An article support rack in accordance with the present disclosure may be used in a facility in which such a transport device is not provided, such as a facility in which human workers place articles in, and retrieves articles from, the article support rack.

(13) Note that an arrangement disclosed in any of the embodiments described above can also be used in combination with any arrangement disclosed in any other embodiment unless inconsistency arises. This applies to any combination of embodiments which are described as "other embodiments". Regarding any other arrangements and features, the embodiments disclosed in the present description are provided for the purposes of illustration only regarding all aspects. Therefore, it is possible to make various suitable changes without departing from the spirit of the present disclosure.

Summary of Embodiments Described Above

A brief summary of the article support rack described above is provided next.

An article support rack having a plurality of levels of rack portions so that the rack portions are arranged one rack portion over another along a vertical direction, each rack portion being capable of supporting a plurality of articles with the articles arranged one adjacent to another along a first direction parallel to a horizontal plane, the article support rack comprises shelf rows each of which is provided to corresponding one of the plurality of levels of rack portions and is configured to support articles from below with each of the plurality of levels of rack portions including a shelf row; and shelf support members which support the shelf rows. Each of the shelf rows includes one or more main body portions each of which is plate-shaped and oriented parallel to a horizontal plane, and rib portions each of which projects downward with respect to corresponding one of the one or more main body portions of a shelf row that the rib portion is a portion of, each of the rib portions extending from corresponding one of the shelf support members in a front-face side direction which is one direction along a second direction which is perpendicular to the first direction as seen along a vertical direction. Each of the shelf rows is supported by the shelf support members in a cantilever-fashion from a back-face side of the each of the shelf rows where the back-face side being a side corresponding to a back-face side direction, which is a direction along the second direction that is opposite from the front-face side direction. wherein outer surfaces of each article include maximum width areas in which a dimension along a lateral width direction of the article is greatest, and width decreasing areas in which a dimension along the lateral width direction of the article decreases toward a depth direction side end of the article with the depth direction being a direction perpendicular to the lateral width direction, wherein each of the shelf rows is configured to support articles with each article being so oriented that the depth direction thereof points toward the back-face side, wherein each of the rib portions is so located, in plan view, to be between two articles that are adjacent to each other along the first direction and are supported by a lower level shelf row which is one of the shelf rows that is located one level below a shelf row to which the rib portion is provided, when such two articles are so supported, wherein each of the rib portions has a first portion so located to be higher than a lower level article which is an article supported by the lower level shelf row, and a second portion located lower than the first portion, when such a lower level article is so supported, and wherein each second portion is so located that the second portion does not overlap with the maximum width areas of a lower level article as seen along the first direction and is so located that, as seen along the first direction, the second portion overlaps with at least one of (a) width decreasing areas and (b) any portion or portions that are located to the back-face side of the width decreasing areas, of the lower level article when supported.

With such an arrangement, since each shelf row includes rib portions in addition to one or more main body portions, each shelf row supported in a cantilever fashion by the shelf support members can be strengthened against bending moment applied to it, thus, allowing proper structural strength of each shelf row for supporting articles to be maintained.

And, with such an arrangement described above, each of such rib portions used to properly maintaining structural strength for supporting articles has a first portion so located to be higher than a lower level article which is an article supported by the lower level shelf row, and a second portion located lower than the first portion. And each second portion is so located that the second portion does not overlap with the maximum width areas of a lower level article as seen along the first direction. This allows for an arrangement in which neither the first portion nor the second portion of the rib portion is located in a space across which two maximum width areas (of two articles that are supported by a lower level shelf row and are adjacent to each other along the first direction) face each other along the first direction. As a result, it becomes possible to secure a distance between a lower level article and other surrounding objects and also to reduce the separation distance, along the first direction, between the two mutually-facing maximum width areas of two lower level articles that are adjacent to each other along the first direction, compared with a case in which a rib portion is located in such a space across which two maximum width areas face each other. And so, the article storage efficiency of the article support rack can be maintained at a high level.

Further, with the arrangement described above, the second portion of each of the rib portions is so located that, as seen along the first direction, the second portion overlaps with at least one of (a) width decreasing areas and (b) any portion or portions that are located to the back-face side of the width decreasing areas, of the lower level article. This makes it easier to make the vertical dimension of the back-face side end portion of each rib portion sufficiently large for the corresponding shelf row to have proper strength for supporting articles, compared with a case in which the second portion is so located that no part of the second portion overlaps with the lower level article. Note that a portion of the second portion that overlaps with a lower level article is located in a space across which outer surfaces (of two lower level articles that are adjacent to each other along the first direction) are located from each other along the first direction. However, the separation distance, along the first direction, between the two width decreasing areas (and the portion or portions on a back-face side of the width decreasing areas) of two lower level articles that are adjacent each other along the first direction is greater than the separation distance between the two mutually-facing maximum width areas of such two lower level articles. Therefore, even when a second portion is located in such a space, the separation distance, along the first direction, between the two mutually-facing maximum width areas of two lower level articles that are adjacent to each other along the first direction can be kept small while properly securing the separation distance between any outer surface of a lower level article and a second portion.

As such, with the arrangement described above, an article support rack is provided for which the article storage efficiency can be improved while properly maintaining article supporting strength of the rack portions.

Here, in addition to one or more main body portions, each of the shelf rows preferably has brackets which support the one or more main body portions from below with each bracket attached to corresponding one of the shelf support members, wherein each of the brackets preferably has corresponding one of the rib portions and an upper-face-side plate-shaped portion which is oriented parallel to a horizontal plane and is connected to an upper end of the corresponding one of the rib portions, and wherein each of the one or more main body portions is preferably fixed to corresponding ones of the brackets with the main body portion in contact, from above, with the upper-face-side plate-shaped portions of the corresponding ones of the brackets.

With such an arrangement, there is a greater degree of freedom for the shape of the rib portion, and the method for manufacturing the rib portion compared with a case in which the rib portion is integrally formed with the corresponding main body portion. This makes it easier to provide required article supporting strength to each shelf row.

In such an arrangement in which each of the shelf rows has the brackets, each of the brackets preferably has a back-face-side plate-shaped portion which is oriented parallel to a vertical plane and is connected to an end portion, on the back-face side, of corresponding one of the rib portions, wherein the back-face-side plate-shaped portion is preferably fixed to corresponding one of the shelf support members with the back-face-side plate-shaped portion in contact with the corresponding one of the shelf support members from the front-face side, which is a side corresponding to the front-face side direction.

With such an arrangement, the size of the contact surface between a bracket and a shelf support member can be made large by increasing the surface area of the back-face-side plate-shaped portion; thus, it becomes easier to fix a bracket firmly to a shelf support member.

In an article support rack having various arrangements described above, each of the shelf rows preferably includes fastened portions each of which is fixed to corresponding one of the shelf support members, wherein each of the shelf support members preferably has fitting-engaged portions each of which is in fitting engagement with corresponding one of the fastened portions.

With such an arrangement, each surface of fitting engagement between the fastened portion and the fitting-engaged portion can provide support against any bending moment that may act on the shelf row, which helps provide proper article supporting strength to a shelf row. In addition, with the arrangement described above, it becomes easier to properly position a shelf row when attaching the shelf row to a shelf support member.

In addition, each second portion is preferably so located to be spaced apart from any outer surface of the lower level article by a distance greater than or equal to a set distance.

With such an arrangement, the separation distance between each second portion and any outer surface of the lower level article can be kept greater than or equal to a set distance. Therefore, the second portion of each of the rib portions can be so located that, as seen along the first direction, the second portion overlaps with at least one of (a) width decreasing areas and (b) any portion or portions that are located to the back-face side of the width decreasing areas, of a lower level article while satisfying the required separation distance specified by standards, etc.

It is considered to be sufficient for the article support rack in accordance with the present disclosure to perform at least one of the results or effects described above.

What is claimed is:

1. An article support rack having a plurality of levels of rack portions so that the rack portions are arranged one rack portion over another along a vertical direction, each rack portion being capable of supporting a plurality of articles with the articles arranged one adjacent to another along a first direction parallel to a horizontal plane, the article support rack comprising:

shelf rows each of which is provided to a corresponding one of the plurality of levels of rack portions and is configured to support articles from below with each of the plurality of levels of rack portions including a shelf row; and shelf support members which support the shelf rows;

wherein each of the shelf rows includes one or more main body portions each of which is plate-shaped and oriented parallel to a horizontal plane, and rib portions each of which projects downward with respect to a corresponding one of the one or more main body portions of one of the shelf rows that the rib portion is a portion of, each of the rib portions extending from a corresponding one of the shelf support members in a front-face side direction which is one direction along a second direction which is perpendicular to the first direction as seen along a vertical direction, wherein each of the shelf rows is supported by the shelf support members in a cantilever-fashion from a back-face side of the each of the shelf rows where the back-face side being a side corresponding to a back-face side direction, which is a direction along the second direction that is opposite from the front-face side direction, wherein outer surfaces of each article include maximum width areas in which a dimension along a lateral width direction of the article is greatest, and width decreasing areas in which a dimension along the lateral width direction of the article decreases toward a depth direction side end of the article with the depth direction being a direction perpendicular to the lateral width direction, wherein each of the shelf rows is configured to support the articles with each article being so oriented that the depth direction thereof points toward the back-face side, wherein each of the rib portions is so located, in plan view, to be between two lower level articles that are adjacent to each other along the first direction and are supported by a lower level shelf row which is one of the shelf rows that is located one level below a shelf row to which the rib portion is provided, when such two lower level articles are so supported, wherein each of the rib portions has a first portion so located to be higher than one of the lower level articles which is an article supported by the lower level shelf row, and a second portion located lower than the first portion, when the one of the lower level articles is so supported, and wherein each second portion is so located that the second portion does not overlap with the maximum width areas of the one of the lower level articles as seen along the first direction and is so located that, as seen along the first direction, the second portion overlaps with at least one of (a) the width decreasing areas and (b) any portion or portions that are located to the back-face side of the width decreasing areas, of the one of the lower level article when supported.

2. The article support rack as defined in claim 1, wherein in addition to the one or more main body portions, each of the shelf rows has brackets which support the one or more main body portions from below with each bracket attached to a corresponding one of the shelf support members, wherein each of the brackets has a corresponding one of the rib portions and an upper-face-side plate-shaped portion which is oriented parallel to a horizontal plane and is connected to an upper end of the corresponding one of the rib portions, and wherein each of the one or more main body portions is fixed to corresponding ones of the brackets with the main body portion in contact, from above, with the upper-face-side plate-shaped portions of the corresponding ones of the brackets.

3. The article support rack as defined in claim 2, wherein each of the brackets has a back-face-side plate-shaped portion which is oriented parallel to a vertical plane and is connected to an end portion, on the back-face side, of a corresponding one of the rib portions, and wherein the back-face-side plate-shaped portion is fixed to a corresponding one of the shelf support members with the back-face-side plate-shaped portion in contact with the corresponding one of the shelf support members from the front-face side, which is a side corresponding to the front-face side direction.

4. The article support rack as defined in claim 1, wherein each of the shelf rows includes fastened portions each of which is fixed to a corresponding one of the shelf support members, and wherein each of the shelf support members has fitting-engaged portions each of which is in fitting engagement with a corresponding one of the fastened portions.

5. The article support rack as defined in claim 1, wherein each second portion is so located to be spaced apart from any outer surface of the lower level article by a distance greater than or equal to a set distance.

* * * * *